United States Patent
Wenner

Patent Number: 5,146,618
Date of Patent: Sep. 8, 1992

[54] AUTOMOTIVE RADIO SUPPORT AND CONVERSION APPARATUS

[76] Inventor: Jeffrey W. Wenner, 108 Pixie Moss Trail, Medford, N.J. 08055

[21] Appl. No.: 527,853

[22] Filed: May 24, 1990

[51] Int. Cl.⁵ .............................................. H04B 1/08
[52] U.S. Cl. .................... 455/345; 455/346; 455/347; 455/349; 455/350
[58] Field of Search ............... 455/345, 346, 348, 349, 455/350, 351; 307/10 AT; 369/11, 12

[56] References Cited

U.S. PATENT DOCUMENTS

| | | | |
|---|---|---|---|
| 2,662,975 | 12/1953 | Schwarz | 455/346 |
| 2,866,895 | 12/1958 | Princ | 455/346 |
| 4,343,564 | 3/1976 | Tushinsky | 369/12 |
| 4,510,589 | 4/1985 | Ito | 369/11 |
| 4,817,191 | 3/1989 | Adams | 455/347 |
| 4,867,292 | 2/1989 | Sorscher | 455/346 |
| 4,870,630 | 9/1989 | Blake | 369/12 |
| 4,870,702 | 9/1989 | Azzouni | 455/346 |

Primary Examiner—Reinhard J. Eisenzopf
Assistant Examiner—Edward Urban
Attorney, Agent, or Firm—Leon Gilden

[57] ABSTRACT

An apparatus including a main housing, with a first and second detachable speaker mounted thereto, each speaker includes a positive and common connection for selective association with an automotive speaker wiring harness. The apparatus includes a cavity for reception of a vehicular radio therewithin and selectively removable forward panels to receive an additional booster amplifier in an upper section and storage, wherein the storage includes an aligned series of "T" shaped recesses to selectively receive audio cassette members or compact disk plates selectively within each "T" shaped slot.

1 Claim, 8 Drawing Sheets

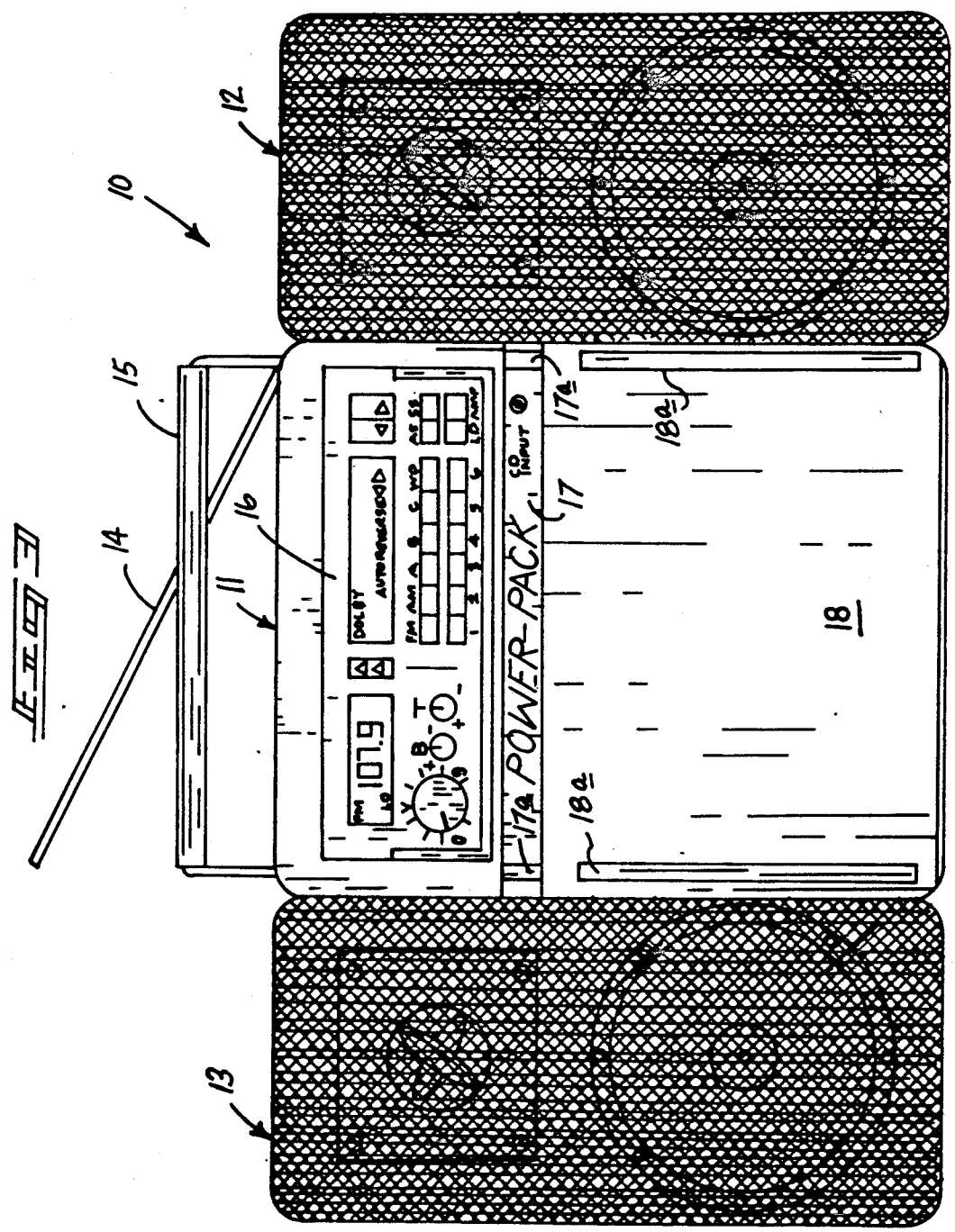

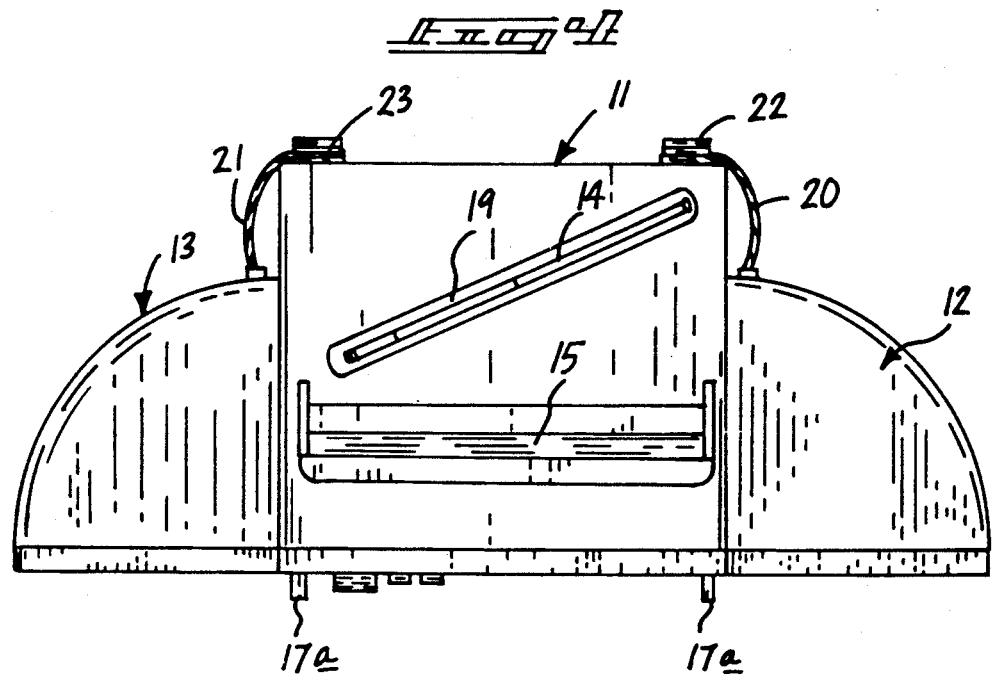
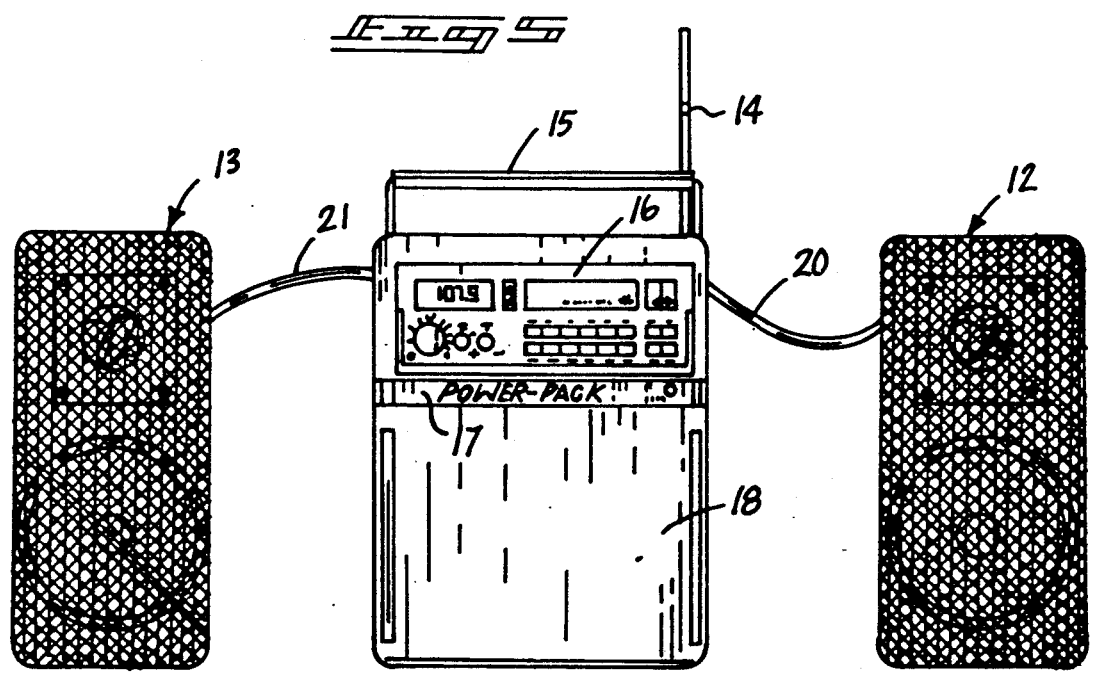

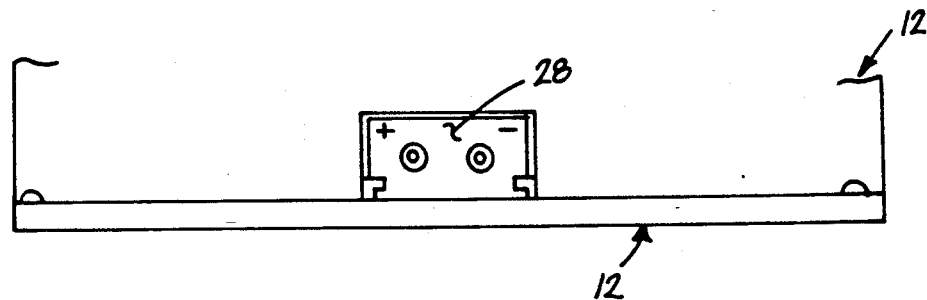
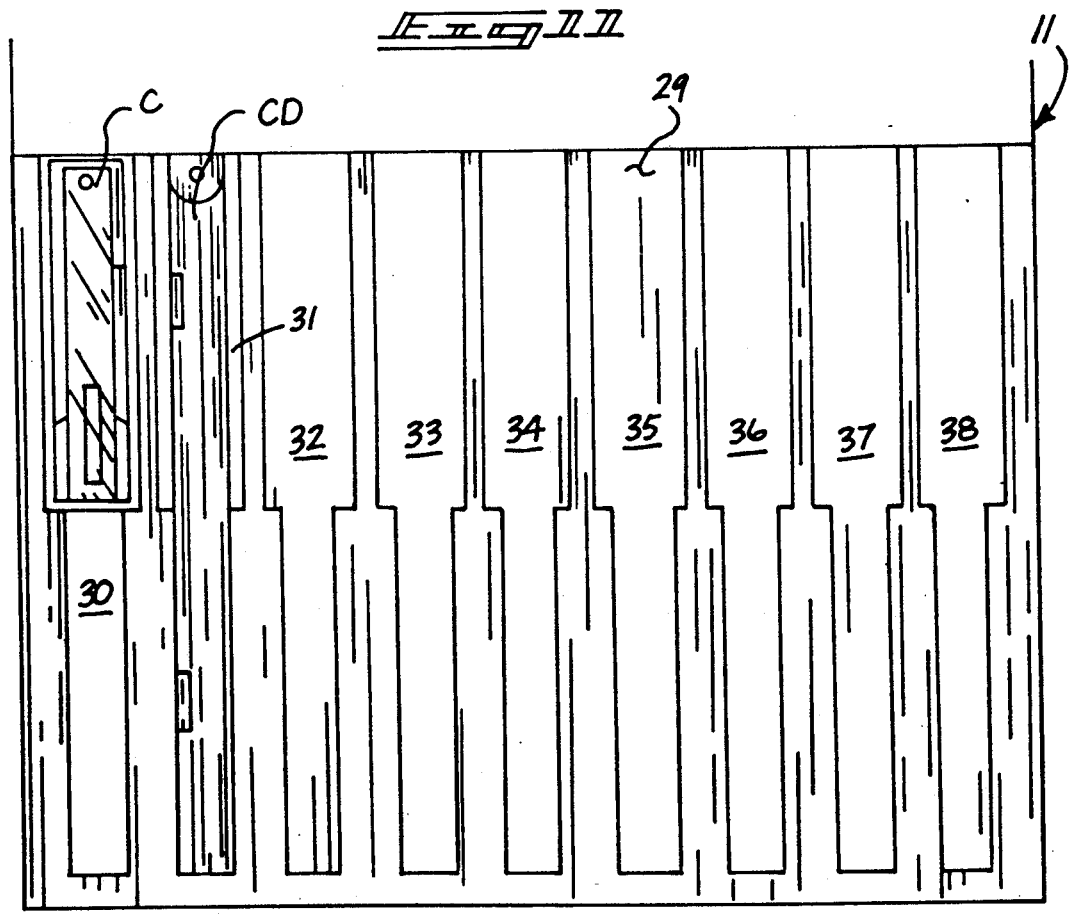

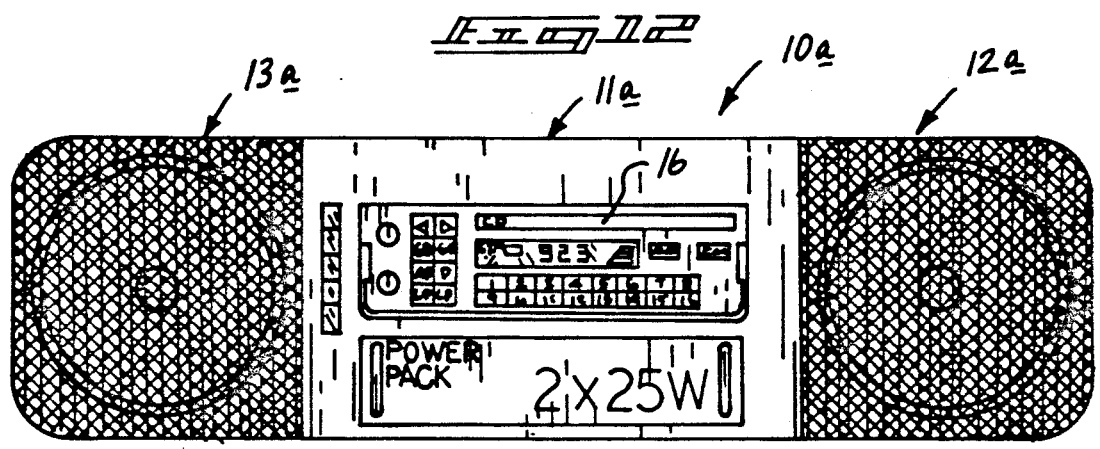
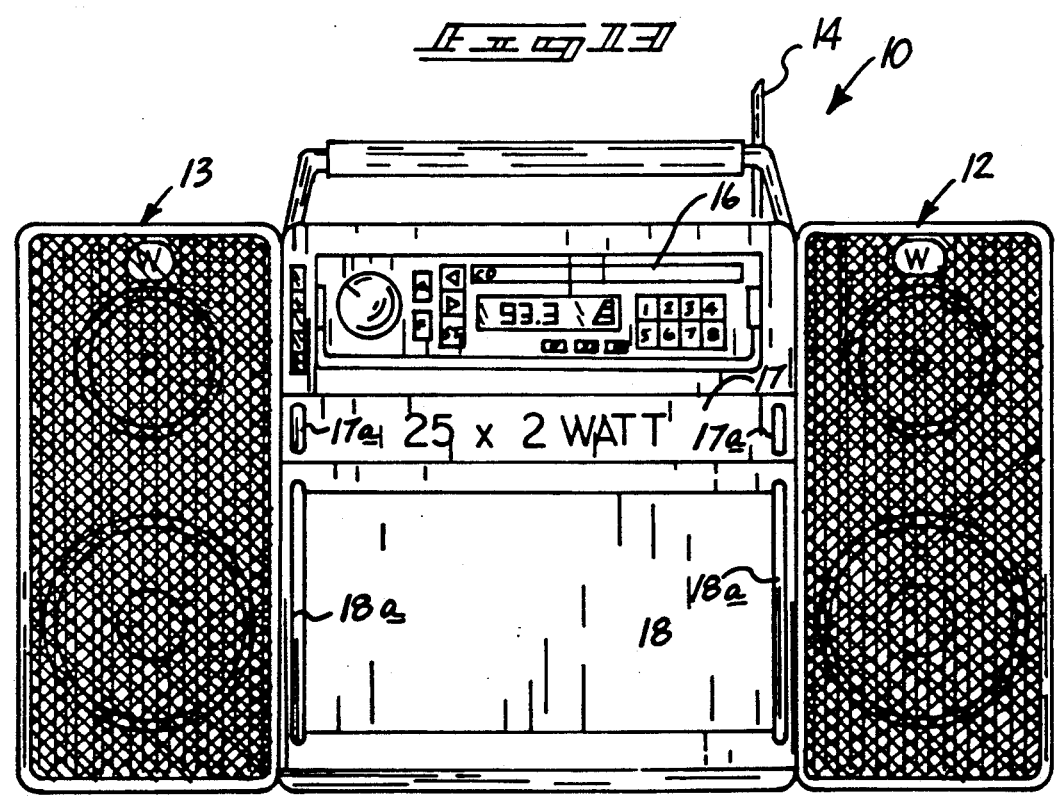

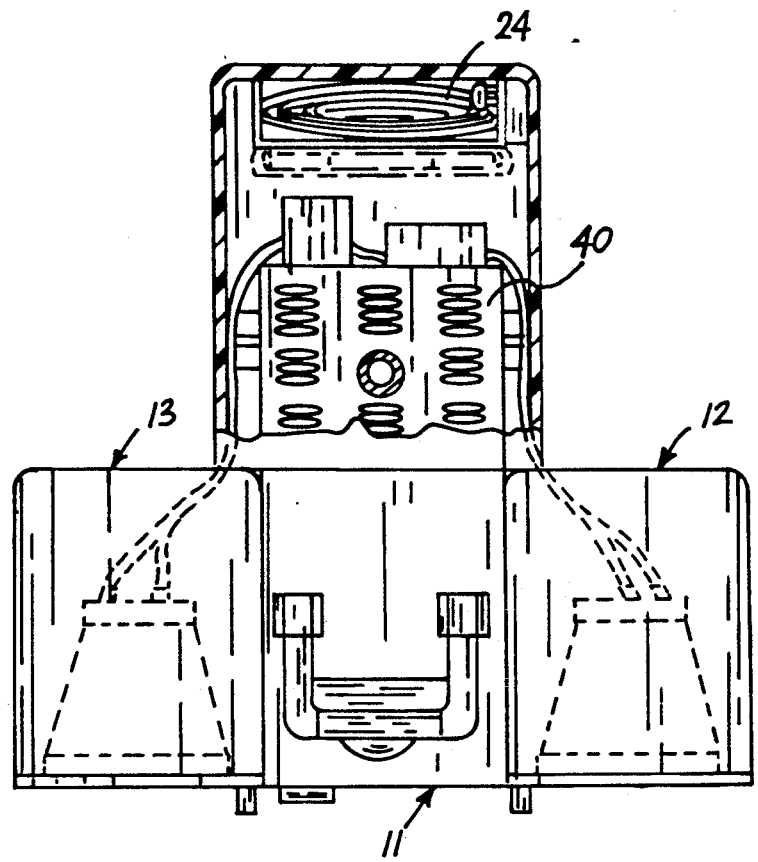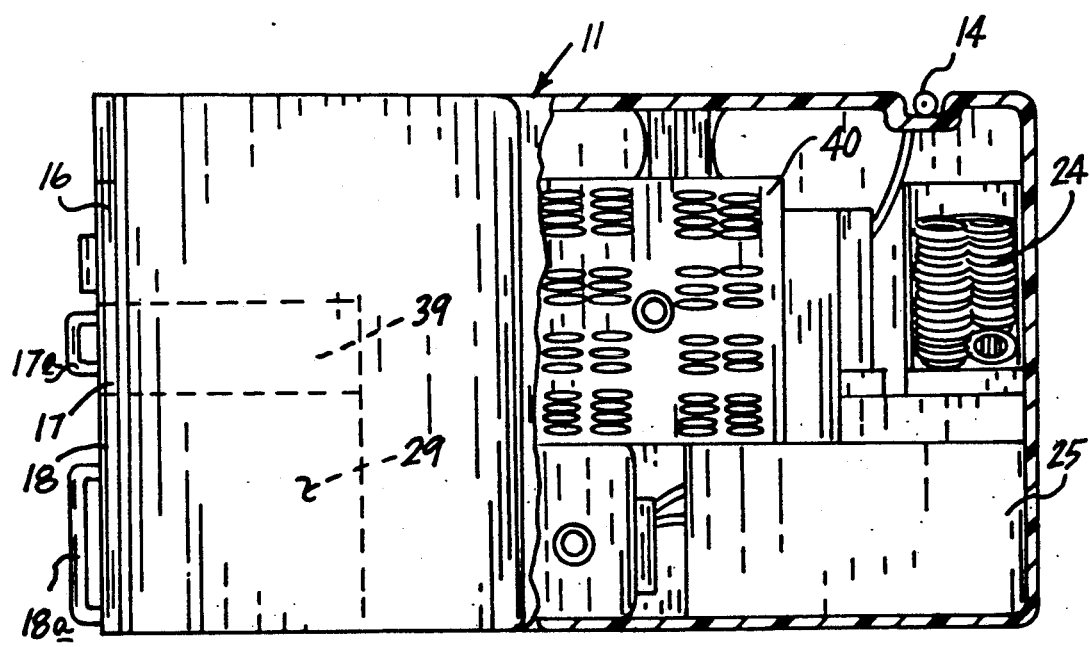

AUTOMOTIVE RADIO SUPPORT AND CONVERSION APPARATUS

BACKGROUND OF THE INVENTION

1. Field of the Invention

The field of invention relates to portable audio apparatus, and more particularly pertains to a new and improved audio radio support and conversion apparatus wherein the same permits accommodation and reception of a vehicular radio within a pre-positioned and arranged cavity of the organization for association with speaker members.

2. Description of the Prior Art

Audio devices have been utilized in the prior art and arranged for association with the electrical system of an associated motor vehicles for selective removal therefrom by owners of the vehicle to prevent theft of the audio devices. The instant invention attempts to permit removal of an audio unit, such as a radio, from an associated automotive environment and permit reception and securement therewithin within a portable unitary housing, including selectively detachable speakers mounted thereto. Examples of the prior art include U.S. Pat. No. 4,807,292 to Sorcher illustrating the use of an automotive radio positioned for reception within a remote player unit utilizing connections for speaker association with the unit to remote speakers.

U.S. Pat. No. 3,071,728 to Grace, et al. sets forth a portable audio radio receive utilizing a bracket member to secure a radio within an automotive environment independent of the vehicular electrical system.

U.S. Pat. No. 4,510,589 to Ito sets forth a device permitting reception of an auxiliary appliance, such as a radio or cassette player, within a housing including speakers associated therewith.

U.S. Pat. No. 3,134,945 to Wertheimer sets forth a vehicle radio mounted within an associated automobile for selective removal therefrom for transport by an individual.

U.S. Pat. No. 2,866,891 to Princ sets forth a radio arranged for mounting and dismounting from within an associated cavity within an automobile for transport and use independently of the automobile by an individual.

As such, it may be appreciated that there continues to be a need for a new and improved automotive radio support and conversion apparatus wherein the same addresses both the problems as ease of use, as well as effectiveness in association of an automotive radio unit, with a storage housing and speaker members selectively associated with the unit.

SUMMARY OF THE INVENTION

In view of the foregoing disadvantages inherent in the known types of portable radio organizations now present in the prior art, the present invention provides an automotive radio support and conversion apparatus wherein the same permits selective securement and use of a vehicular radio within a housing for transport and use by an individual independent of a vehicle. As such, the general purpose of the present invention, which will be described subsequently in greater detail, is to provide a new and improved automotive radio support and conversion apparatus which has all the advantages of the prior art portable radio organizations and none of the disadvantages.

To attain this, the present invention provides an apparatus including a main housing, with a first and second detachable speaker mounted thereto, each speaker includes an automotive speaker wiring harness. The apparatus includes a cavity for reception of a vehicular radio therewithin and selectively removable forward panels to receive an additional booster amplifier in an upper section and storage, wherein the storage includes an aligned series of "T" shaped recesses to selectively receive audio cassette members or compact disk plates selectively within each "T" shaped slot.

My invention resides not in any one of these features per se, but rather in the particular combination of all of them herein disclosed and claimed and it is distinguished from the prior art in this particular combination of all of its structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved automotive radio support and conversion apparatus which has all the advantages of the prior art portable radio organizations and none of the disadvantages.

It is another object of the present invention to provide a new and improved automotive radio support and conversion apparatus which may be easily and efficiently manufactured and marketed.

It is a further object of the present invention to provide a new and improved automotive radio support and conversion apparatus which is of a durable and reliable construction.

An even further object of the present invention is to provide a new and improved automotive radio support and conversion apparatus which is susceptible of a low cost of manufacture with regard to both materials and labor, and which accordingly is then susceptible of low prices of sale to the consuming public, thereby making such automotive radio support and conversion apparatus economically available to the buying public.

Still yet another object of the present invention is to provide a new and improved automotive radio support and conversion apparatus which provides in the apparatuses and methods of the prior art some of the advantages thereof, while simultaneously overcoming some of the disadvantages normally associated therewith.

Still another object of the present invention is to provide a new and improved automotive radio support and conversion apparatus wherein the same permits securement and use of an automotive radio independent of the automobile system.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 3 is an orthographic view, taken in elevation, of the instant invention.

FIG. 4 is a top orthographic view of the instant invention.

FIG. 5 is an orthographic view, taken in elevation, of the instant invention and the speakers separated therefrom.

FIG. 10 is an orthographic top view of the speaker and speaker wire mount structure.

FIG. 11 is an orthographic view, taken in elevation, of the unique storage unit utilized by the instant invention.

FIG. 12 is an orthographic view, taken in elevation, of a modified housing utilized by the instant invention.

FIG. 13 is an orthographic view; taken in elevation, of the instant invention.

FIG. 14 is an orthographic top view, partially in section, of the instant invention.

FIG. 15 is an orthographic side view, partially in section, of the instant invention.

DESCRIPTION OF THE PREFERRED EMBODIMENT

Figure 1:
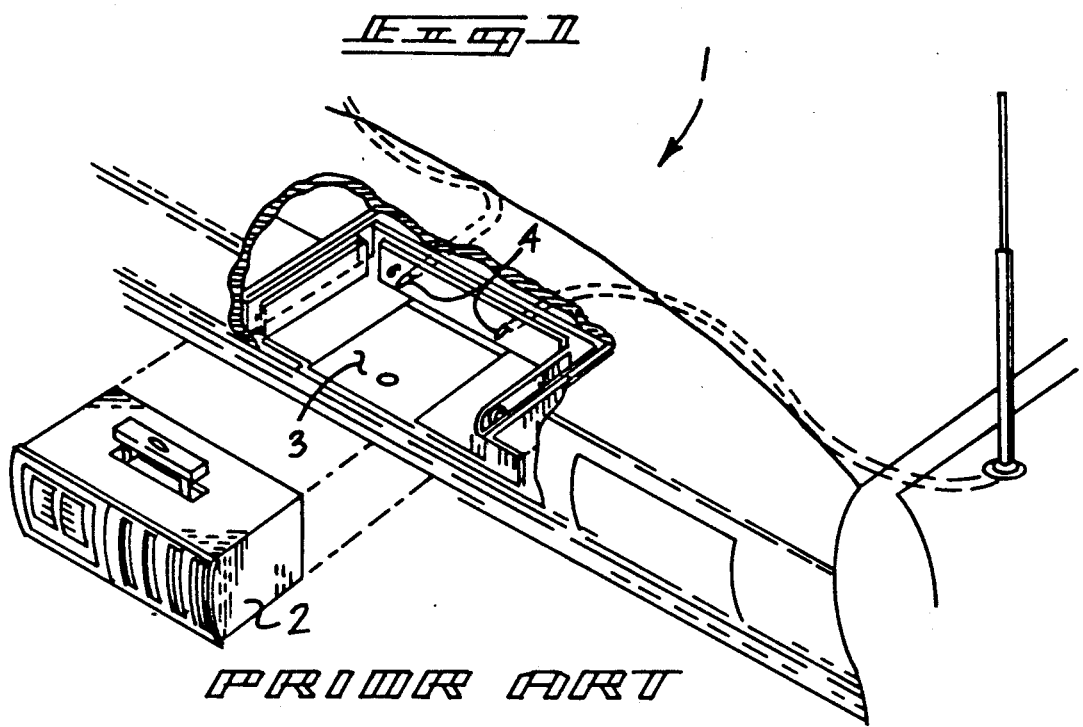
FIG. 1 is an isometric illustration of a prior art portable radio apparatus.

With reference now to the drawings, and in particular of FIGS. 1 to 15 thereof, a new and improved automotive radio support and conversion apparatus embodying the principles and concepts of the present invention and generally designated by the reference numeral 10 will be described.

Figure 2:
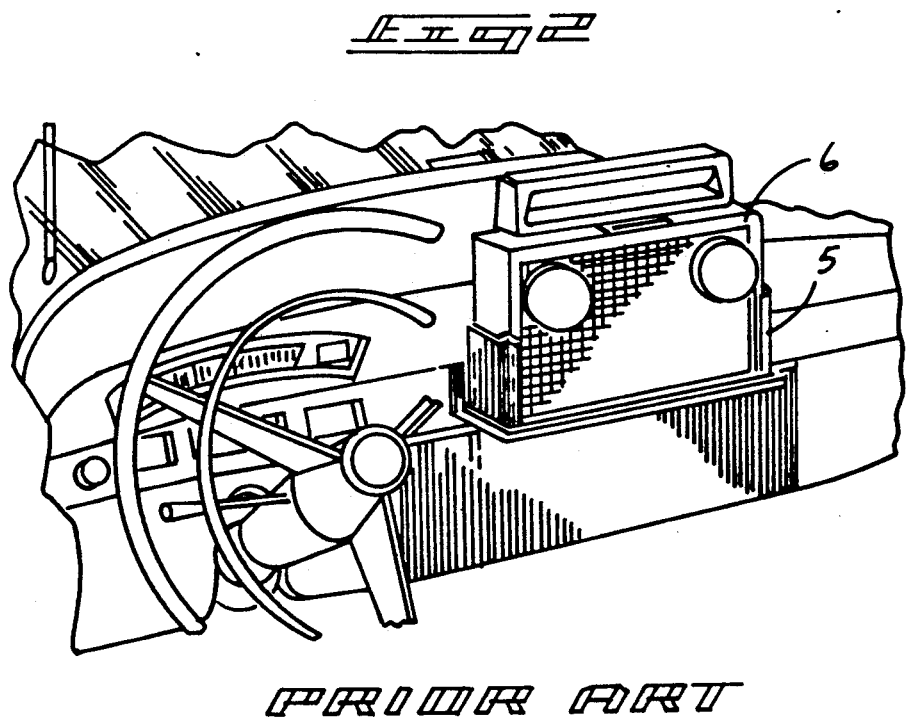
FIG. 2 is an isometric illustration of a further prior art automotive radio apparatus.
Figure 6:
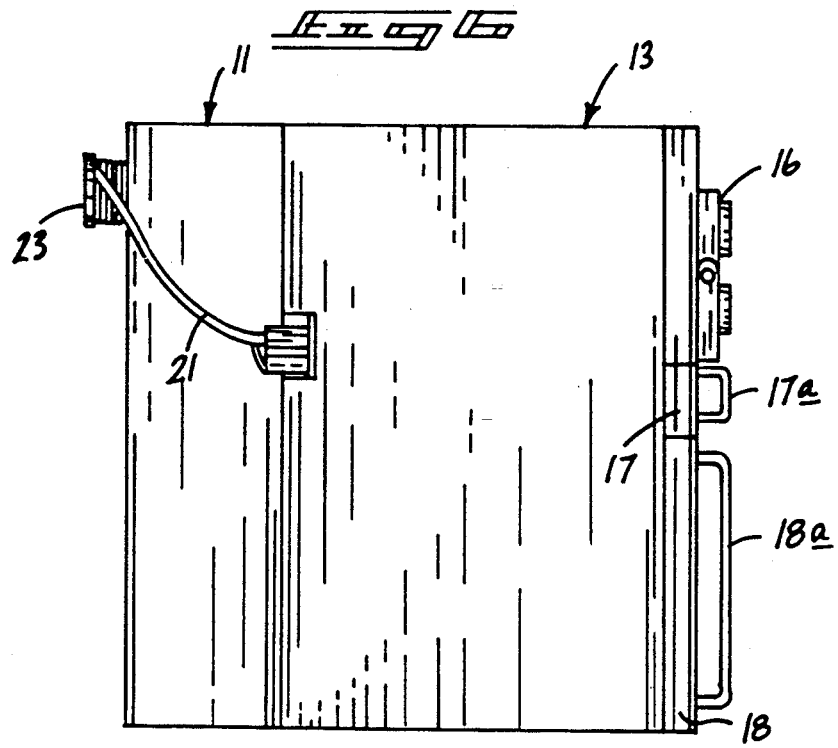
FIG. 6 is an orthographic end view of the instant invention.

FIG. 1 illustrates a prior art vehicular radio support apparatus 1, wherein a radio 2 is received within a cavity 3 of a dashboard in an automotive vehicle, wherein electrical connectors 4 are fixedly mounted for electrical association with a radio 2. FIG. 2 illustrates a further prior art device utilizing a mounting framework 5 for receiving a radio 6 in a fixed secured position relative to an automotive dashboard for use by an individual.

More specifically, the automotive radio support and conversion apparatus 10 of the instant invention essentially comprises a central housing 11, including a right speaker unit 12 and a left speaker unit 13 selectively securable to opposed sides of the central housing 11. A pivotally mounted telescoping antenna 14 is mounted to a top wall of the housing 11 and is nested within an antenna semi-cylindrical recess 19 (see FIG. 4) for reception of the antenna when not in use. A handle 15 is pivotally mounted to the top wall and is received within an associated antenna recess within the top wall, as illustrated in FIG. 4, to define a compact structure for positioning and use. The right speaker includes a right speaker connector wire 20, wherein the left speaker 13 includes a comparable left speaker connector wire 21, each of several feet in length to permit remote positioning each speaker relative to the central housing 11. The right and left speaker connector wires 20 and 21 are selectively wound about a selective right and left spool 22 and 23 mounted to a rear wall of the housing 11 for wound support of speaker wire when the speakers are secured to the housing, in a manner as illustrated in FIG. 4 for example. An automotive radio unit 16 is receivable within a recess formed within the housing through a forward wall thereof, and is in electrical communication with an associated amplifier unit formed within the housing, in a manner as illustrated in U.S. Pat. No. 4,807,292 incorporated herein by reference.

Figure 7:
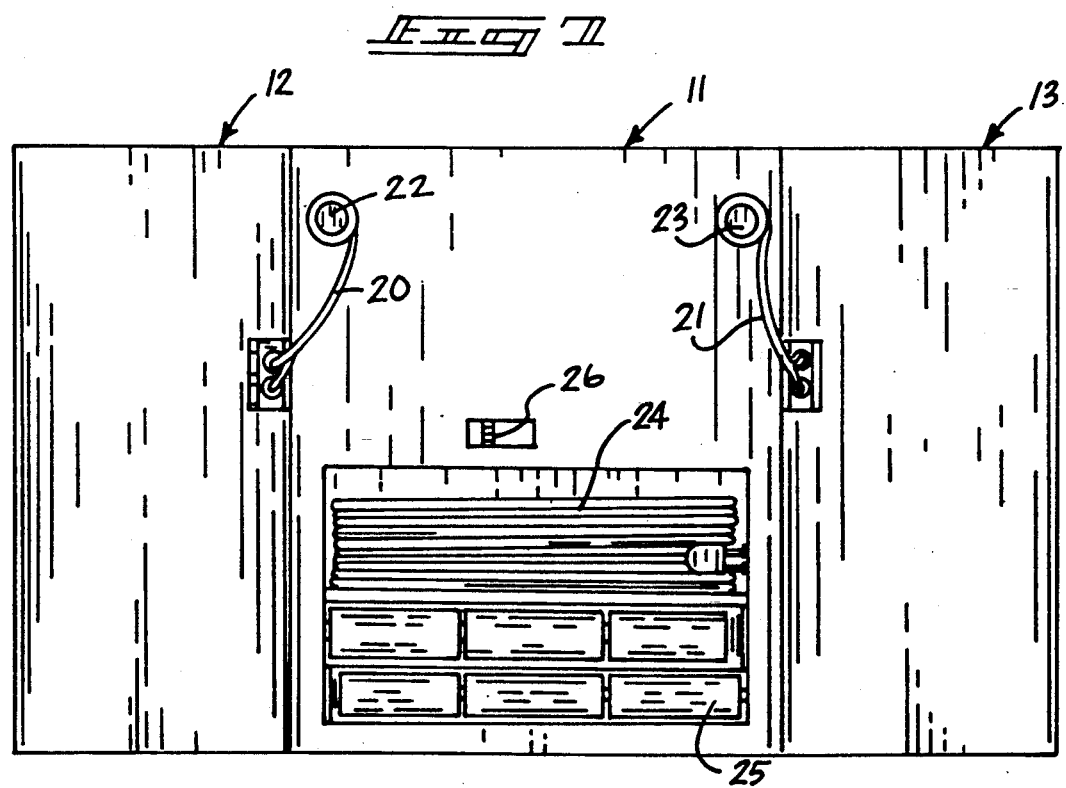
FIG. 7 is an orthographic rear view, taken in elevation, of the instant invention.

Reference to FIG. 7 illustrative the use of an alternating current electrical cord 24 positioned within a recess through the rear wall of the housing 11 overlying a rechargeable battery pack 25. An AC/DC switch 26 permits selective use of alternating current or direct current from the battery pack 25.

Figure 8:
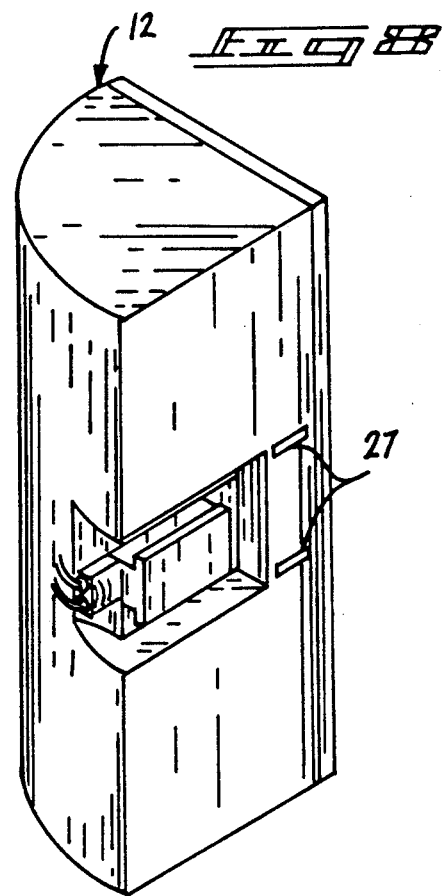
FIG. 8 is an isometric illustration of a typical speaker unit utilized by the instant invention.
Figure 9:
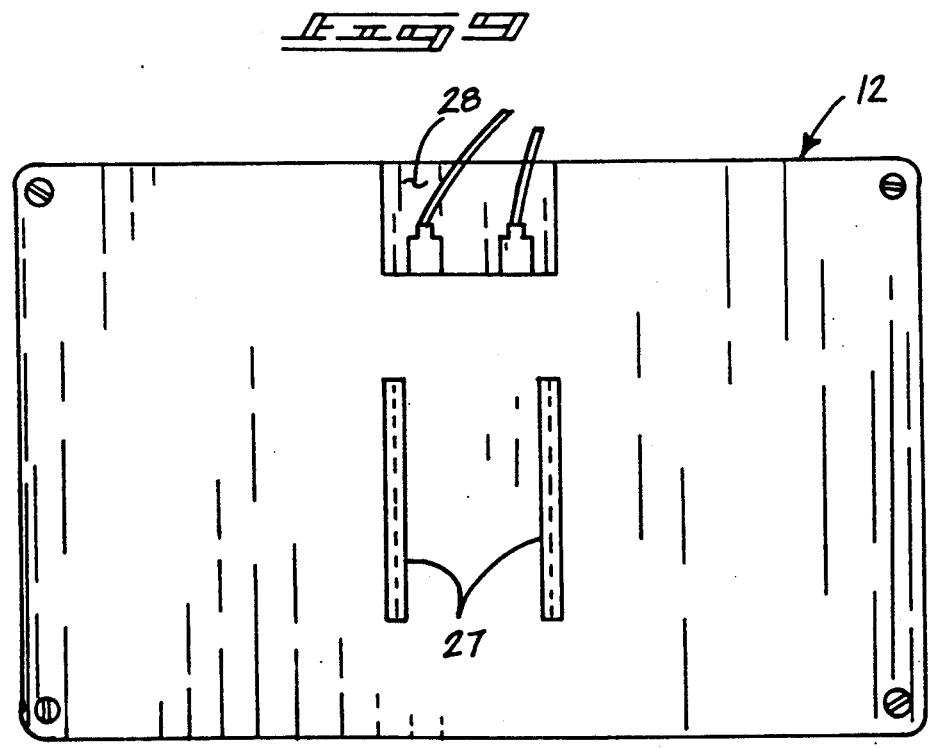
FIG. 9 is an orthographic end view of a speaker member utilized by the instant invention.

Reference to FIGS. 8 and 9 illustrate the use of speaker slots 27 securable to ribs mounted to opposed sides of the housing 11 to permit selective securement of the speakers to the housing 11 for transport of the unit. A speaker wire cavity 28 is formed through a rear wall of each speaker 12 and 13 in a manner as illustrated in FIG. 12, wherein the plug connections permit selective association of each speaker, with speaker wires mounted and formed within an autmotive environment for selective use within an automobile, if required.

The central housing 11 includes an auxiliary amplifier panel cover 17, including auxiliary cover panel handle 17a of a generally "U" shaped configuration mounted to each side of the panel to permit access to a cavity to secure selective amplifier units therewithin, wherein an underlying storage housing cover panel 18 includes storage housing cover panel handles 18a, also of "U" shaped configuration, fixedly mounted to each side of the panel 18 for selective removal of the panel 18 to permit access to a lower compartment 29 underlying the upper compartment 39, in a manner as illustrated in FIG. 15 for example. The lower compartment 29 extends rearwardly of the forward face of the housing 11 underlying the radio unit 16 and is formed with a series of aligned "T" shaped cavities defined by a first, second, third, fourth, fifth, sixth, seventh, eighth, and ninth "T" shaped cavity 31-38 inclusively. Each "T" shaped cavity permits reception of a cassette member "C" within the upper portion of each cavity, or alternatively permits reception of compact disk plates (CD) mounted throughout the vertical extent of each "T" shaped cavity. FIGS. 14 and 15 illustrate the housing 11 in exaggerated configuration to illustrate the positioning of the amplifier portion 40 within the housing and its association with the organization.

Accordingly in use, the individual may transport the housing formed of a polymeric fluid impermeable material that resists shock upon impact and enables such transport in a convenient manner. The lower compartment 29 and the aligned array of "T" shaped cavities permits convenient storage of compact disk plates or alternative cassette members within the "T" shaped cavities in a convenient and securable manner.

FIG. 12 illustrates a modified housing 11a utilizing fixed right and left speakers 12a and 13a in an abbreviated housing configuration eliminating the storage compartment of the instant invention.

As to the manner of usage and operation of the instant invention, the same should be apparent from the above disclosure, and accordingly no further discussion relative to the manner of usage and operation of the instant invention shall be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. An automotive radio support and conversion apparatus comprising, in combination,
   a housing, the housing including a forward wall, a top wall, a rear wall, a right side wall, and a left side wall, the right side wall including a right speaker selectively securable thereto, and the left side wall including a left speaker selectively securable thereto, and
   an audio unit securable within said housing, and
   power means within said housing for directing selectively direct current or alternating current to said audio means, and
   a battery pack mounted through a rear wall of said housing, and
   an alternating current electrical cord mounted through the wall of said housing adjacent the battery pack, and
   a storage unit mounted within said housing underlying the audio unit, and
   wherein the top wall of the housing includes a telescoping antenna pivotally mounted thereto, and a semi-cylindrical recess mounted to the top wall of the housing for receiving the antenna in a nested configuration therewithin, and
   wherein the storage unit includes a panel removably mounted thereto, and
   wherein the panel includes a first and second "U" shaped handle fixedly mounted to a forward surface of the panel to permit selective removal of the panel relative to the housing, and
   including a compartment directed rearwardly of the panel underlying the audio unit, the compartment including a series of vertical partition walls mounted within the compartment, and
   the partition panels define a plurality of "T" shaped cavities, the "T" shaped cavities vertically aligned within the compartment to selectively receive a cassette member or a compact disk member within each "T" shaped cavity, and
   the housing is formed of a polymeric fluid impermeable material, and
   the right speaker and the left speaker include a respective right speaker wire and left speaker wire directed from each respective right and left speakers to the housing, and the housing including a right spool and a left spool to selectively accommodate the respective right and left speaker wire thereabout for storage, and
   each right and left spool is fixedly and orthogonally mounted to the rear wall of the housing, and
   each right and left speaker includes a speaker wire cavity formed through the rear wall of each speaker, the speaker wire cavity of each speaker including a plurality of speaker wire connectors to permit selective association of each speaker, with alternative audio speaker outputs from an associated amplifier.

* * * * *